(12) United States Patent
Lin et al.

(10) Patent No.: US 8,883,282 B2
(45) Date of Patent: Nov. 11, 2014

(54) ELECTRODE TAPE

(75) Inventors: Ching-Huang Lin, Miaoli County (TW); Rong-Chang Liang, Miaoli County (TW); Pei-Chang Tsai, Miaoli County (TW)

(73) Assignee: Neo Solar Power Corp., Hsinchu Science Park, Hsinchu (TW)

( * ) Notice: Subject to any disclaimer, the term of this patent is extended or adjusted under 35 U.S.C. 154(b) by 201 days.

(21) Appl. No.: 13/437,944

(22) Filed: Apr. 3, 2012

(65) Prior Publication Data

US 2012/0291837 A1 Nov. 22, 2012

(30) Foreign Application Priority Data

May 17, 2011 (TW) .............................. 100117343 A
May 17, 2011 (TW) .............................. 100117346 A

(51) Int. Cl.
*B32B 9/00* (2006.01)
*B32B 33/00* (2006.01)
*B32B 7/12* (2006.01)
*C09J 7/00* (2006.01)
*C09J 9/02* (2006.01)
*H01B 1/22* (2006.01)
*H01L 31/05* (2014.01)
*H01R 4/04* (2006.01)

(52) U.S. Cl.
CPC .... *C09J 7/00* (2013.01); *C09J 9/02* (2013.01); *H01B 1/22* (2013.01); *H01L 31/0508* (2013.01); *H01L 31/0512* (2013.01); *H01R 4/04* (2013.01); *C09J 2201/28* (2013.01); *C09J 2201/32* (2013.01); *C09J 2201/602* (2013.01); *C09J 2203/322* (2013.01); *Y02E 10/50* (2013.01)

USPC ....... 428/41.7; 428/40.1; 428/40.9; 428/41.1; 428/343

(58) Field of Classification Search
CPC ............. C09J 2201/32; C09J 2201/602; C09J 2201/28; C09J 2203/322; H01B 1/22; H01L 31/0508; H01L 31/0512; H01R 4/04
USPC ............................. 428/40.1, 40.9, 41.1, 343
See application file for complete search history.

(56) References Cited

U.S. PATENT DOCUMENTS

| | | | |
|---|---|---|---|
| 4,737,112 A | 4/1988 | Jin | |
| 5,059,262 A | 10/1991 | Calhoun | |
| 5,240,761 A | 8/1993 | Calhoun | |
| 5,308,667 A * | 5/1994 | Calhoun et al. | 428/40.9 |
| 5,813,870 A | 9/1998 | Gaynes | |

(Continued)

FOREIGN PATENT DOCUMENTS

| | | |
|---|---|---|
| CN | 101108532 A | 1/2008 |
| EP | 1 020 505 A2 | 7/2000 |

(Continued)

*Primary Examiner* — Patricia L Nordmeyer
(74) *Attorney, Agent, or Firm* — Winston Hsu; Scott Margo

(57) ABSTRACT

An electrode tape, a solar module and methods for manufacturing the same are disclosed. The electrode tape includes an adhesive film and a conductive structure. The adhesive film includes a first adhesive surface and a second adhesive surface which faces an opposite direction to the first adhesive surface. The conductive structure is embedded in the adhesive film with a first contact point exposed on the first adhesive surface and a second contact point exposed on the second adhesive surface. The solar module includes a first solar cell and a second solar cell which are electrically connected with each other through the electrode tape.

8 Claims, 16 Drawing Sheets

(56) References Cited

U.S. PATENT DOCUMENTS

| | | |
|---|---|---|
| 5,939,190 A * | 8/1999 | Pfaff et al. .................... 428/344 |
| 6,394,821 B1 | 5/2002 | Matsumura |
| 6,936,761 B2 | 8/2005 | Pichler |
| 7,432,438 B2 | 10/2008 | Rubin |
| 2007/0144577 A1 | 6/2007 | Rubin |
| 2009/0025788 A1 | 1/2009 | Rubin |
| 2010/0240166 A1 | 9/2010 | Ishii |
| 2010/0288328 A1 | 11/2010 | Fukushima |

FOREIGN PATENT DOCUMENTS

| | | |
|---|---|---|
| EP | 1 020 505 A3 | 12/2000 |
| JP | S6450307 A | 2/1989 |
| JP | 2000331538 A | 11/2000 |
| JP | 200225351 A | 1/2002 |
| JP | 2003109690 A | 4/2003 |
| JP | 2009218315 A | 9/2009 |
| JP | 2011109026 A | 6/2011 |

* cited by examiner

ELECTRODE TAPE

RELATED APPLICATIONS

This application claims the benefits of Taiwan Application No. 100117343, filed on May 17, 2011, titled "Electrode Tape and Method for Manufacturing the Same" and Taiwan Application No. 100117346, filed on May 17, 2011, titled "Solar Cell Module and Method for Manufacturing the Same" which are herein incorporated in their entirety by reference.

BACKGROUND

Solar cells convert light into electricity based on photoelectric effect and are used as for providing clean energy without pollution. Nowadays, solar cells have been widely researched and manufactured and are gradually adopted to replace traditional electric power.

Generally, solar cells are formed with a semiconductor device, such as monocrystalline silicon, multicrystalline silicon, amorphous silicon or other thin film semiconductor devices which include a p-n junction. The method of forming the p-n junction includes doping n-type or p-type ions into semiconductor device by diffusion or ion implantation. When the semiconductor device is illuminated by light, electron hole pairs are generated in semiconductors, such as silicon, and electrons and holes are separated drifted to form a current by an internal field formed by the p-n junction. In order to collect the current generated by the solar cells, metal electrodes are formed on surfaces of the solar cells. As shown in FIG. 1, the metal electrodes formed on the solar cells 10, 20 include back electrodes 12, 22, finger electrodes 13, 23 which are formed on the front side 11, 21, and busbar (or buss bar) electrodes 14, 24 which are formed on the two terminals of the finger electrodes 13, 23.

The finger electrodes 13, 23 and the busbar electrodes 14, 24 are usually formed by coating silver paste on surfaces of the solar cells 10, 20 by screen printing. Besides, the finger electrodes 13, 23 are usually made with smaller widths and arranged in parallel with a predetermined interval to minimize shading effect. The back electrodes 12, 22 also can be formed by screen printing and is usually made of aluminum. However, the back electrodes 12, 22 are different from the finger electrodes 13, 23 that they can be formed by coating aluminum on a whole surface of the solar cells 10, 20.

A single solar cell usually provides an output voltage of about 0.5 volt to about 0.7 volt, and therefore a plurality of solar cells are connected in series to constitute a solar module to provide a required operating voltage. As shown in FIG. 1, neighboring solar cells are usually series connected with their front and back electrodes via ribbons 30. For example, a terminal of the ribbon 30 is connected to the busbar electrode 14 formed on the front side of the solar cell 10 while the other terminal of the ribbon 30 is connected to the back electrode 22 of the solar cell 20 and therefore a solar module 1 is formed with serially-connected solar cells, hereinafter a "series-connected type solar module."

The above process requires steps of forming metal electrodes and soldering ribbons. Since traditional soldering process is usually performed at a higher temperature, micro cracks may be generated on the surface of the crystalline silicon solar cells because of the thermal expansion/shrinkage coefficient difference between metal electrodes and crystalline silicon substrate.

SUMMARY

An electrode tape includes an adhesive film and a conductive structure embedded in the adhesive film. The adhesive film includes a first adhesive surface and a second adhesive surface which faces toward an opposite direction to the first adhesive surface. The conductive structure includes a first contact point and a second contact point. The first contact point is exposed on the first adhesive surface and the second contact point is exposed on the second adhesive surface.

A method of manufacturing an electrode tape includes steps of adhering an adhesive material to a sidewall of a conductive structure, and curing the adhesive material into a film having a first adhesive surface and a second adhesive surface which faces toward an opposite direction to the first adhesive surface. In the adhering and curing steps, the method further includes exposing a first contact point of the conductive structure on the first adhesive surface and exposing a second contact point of the conductive structure on the second adhesive surface.

A solar module includes a first solar cell and a second solar cell which are electrically connected with each other through the electrode tape. The first solar cell includes a first front electrode and a first back electrode. The second solar cell includes a second front electrode and a second back electrode. The first front electrode of the first solar cell is electrically connected with the second back electrode of the second solar cell via the electrode tape.

A method of manufacturing a solar module includes adhering a first adhesive surface of an electrode tape to a front electrode of a first solar cell and adhering a second adhesive surface of the electrode tape to a back electrode of a second solar cell. The step of adhering the first adhesive surface of the electrode tape including contacting a first contact point exposed on the first adhesive surface of the electrode tape with the front electrode of the first solar cell. The step of adhering the second adhesive surface of the electrode tape includes contacting a second contact point exposed on the second adhesive surface of the electrode tape with the back electrode of the second solar cell.

BRIEF DESCRIPTION OF THE DRAWINGS

The above and other objects, features and other advantages of the present application will be more clearly understood from the following detailed description taken in conjunction with the accompanying drawings, in which:

FIG. 6b is a front view of a solar cell shown in FIG. 6a.

FIG. 8b is a cross-sectional view of the molding belt of the electrode tape manufacturing machine shown in FIG. 8a.

FIG. 8c is a cross-sectional view of an electrode tape formed by the electrode tape manufacturing machine shown in FIG. 8a.

FIG. 9a is a top view of the molding belt of the electrode tape manufacturing machine shown in FIG. 8a.

DETAILED DESCRIPTION

Figure 1:
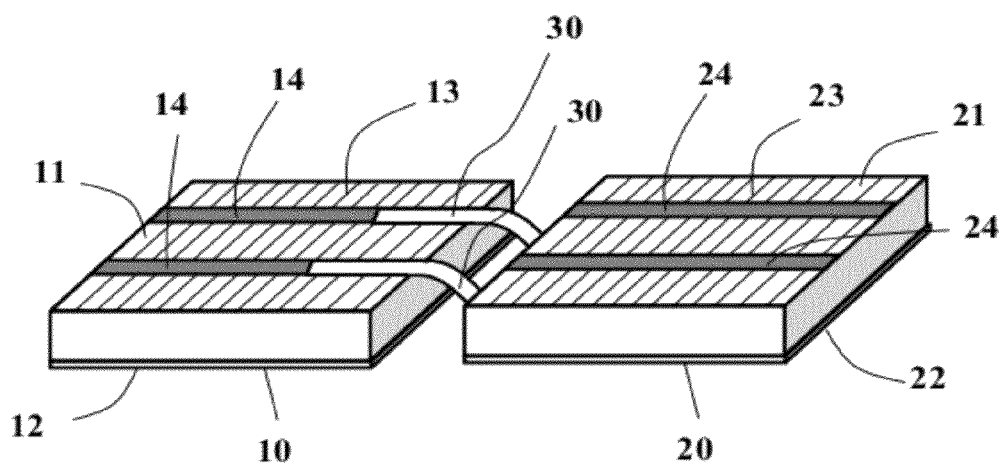
FIG. 1 is a front view of a series connected type solar module.

Hereinafter, several embodiments will be described with reference to the accompanying drawings. The components of drawings are not to precise scale and may be exaggerated in view of thickness, width, length, etc for explanation purpose. Herein, the similar or identical reference numerals will denote the similar or identical components throughout the drawings.

Throughout this description, "electrode tape" refers to a tape having at least one electrode. "Electrode" refers to a conductive structure. "Tape" refers to a film, a strip, a sheet or other similar structure which includes an adhesive material and can be stored as rolls, stacked pieces with proper cutting or other suitable methods. At room temperature, the surfaces of the tape can be adhesive or non-adhesive. In one embodiment, for example, the tape's surface is non-adhesive under room temperature but becomes adhesive by heating.

Figure 2:
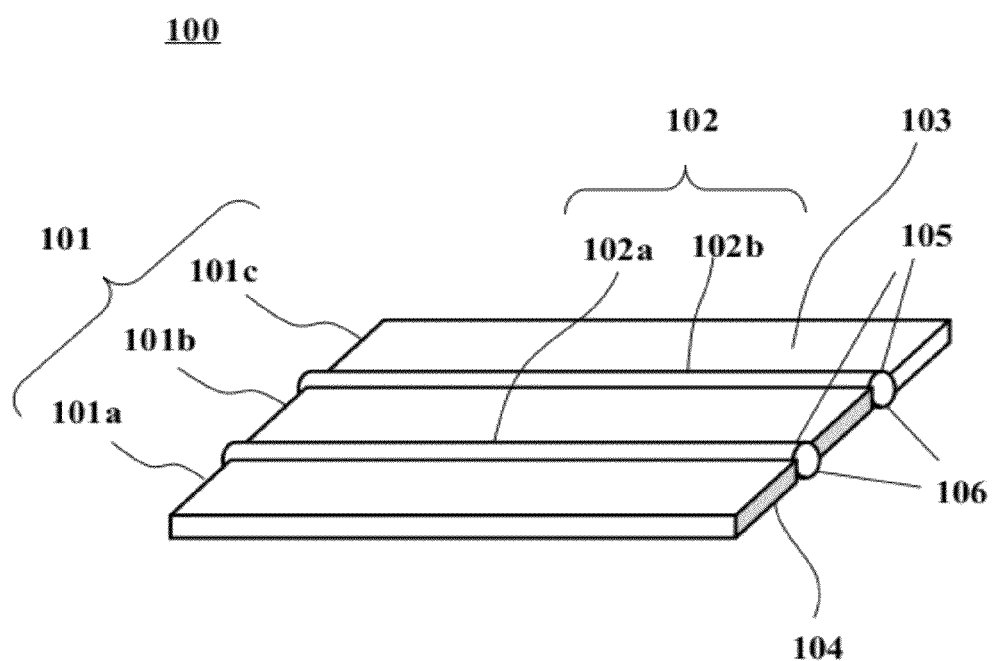
FIG. 2 is a front view of an electrode tape according to an embodiment of the present application.

Referring to FIG. 2, it is a front view of an electrode tape according to an embodiment of the present application. As shown in the figure, the electrode tape 100 of this embodiment includes an adhesive film 101 and a conductive structure 102. The adhesive film 101 includes a first portion 101a, a second portion 101b and a third portion 101c. The conductive structure 102 includes two parallel metal wires 102a and 102b, wherein the metal wire 102a of the conductive structure 102 is disposed between the first portion 101a and the second portion 101b, while the metal wire 102b is disposed between the second portion 101b and the third portion 101c.

The adhesive film 101 includes a first adhesive surface 103 and a second adhesive surface 104. The first adhesive surface 103 and the second adhesive surface 104 are respectively a top surface and a bottom surface of the adhesive film 101 and face opposite directions with each other. The first portion 101a, the second portion 101b and the third portion 101c of the adhesive film 101 are formed of adhesive material. Thus, the first portion 101a and the second portion 101b are adhered to sidewalls of the metal wire 102a of the conductive structure 102, while the second portion 101b and the third portion 101c are adhered to sidewall of the metal wire 102b of the conductive structure.

Each of the metal wires 102a, 102b of the conductive structure 102 includes a first contact point 105 and a second contact point 106. The first contact points 105 are exposed on the first adhesive surface 103 of the adhesive film 101 while the second contact points 106 are exposed on the second adhesive surface 104 of the adhesive film 101. In other words, the substantial parts of metal wires 102a and 102b are embedded in the adhesive film 101 while the first contact points 105 and the second contact points 106 are exposed on the adhesive film 101.

For example, the first adhesive surface 103 and the second adhesive surface 104 of the adhesive film 101 is adhesive under room temperature in one embodiment. However, in other embodiments, the adhesive film 101 may be formed of thermal plastic adhesive material, which is non-adhesive at room temperature and becomes adhesive by heating, for example. Preferably, the adhesive film 101 can be selected from insulating, transparent and thermal stabile adhesive materials, such as acrylic adhesive, silicon adhesive, epoxy adhesive, ethylene vinyl acetate adhesive, polyvinyl ether adhesive, polyurethane adhesive, or polyamide adhesive. In addition to the organic adhesive materials mentioned above, the adhesive film 101 also can be formed of inorganic adhesive materials.

Figure 3A:
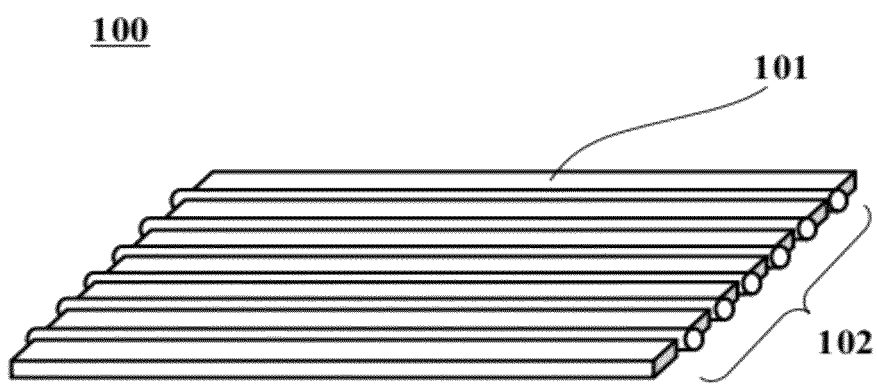
FIG. 3a is a front view of an electrode tape according to another embodiment of the present application.
Figure 3B:
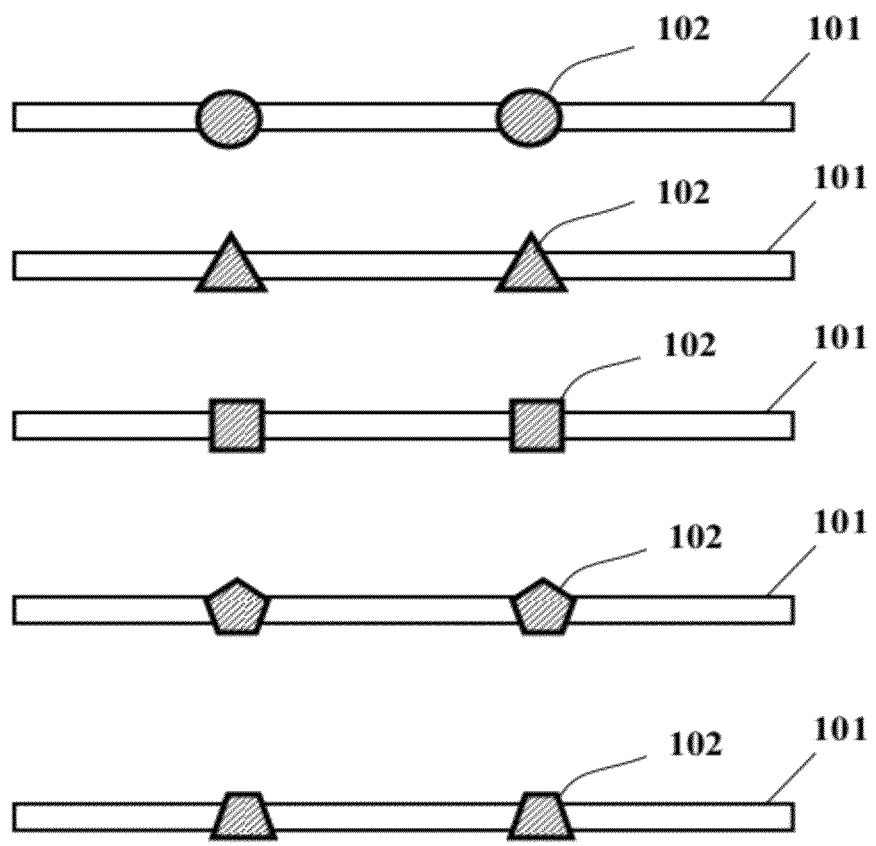
FIG. 3b is a cross-sectional view of metal wires included in electrode tapes according to a plurality of embodiments of the present application.
Figure 3C:
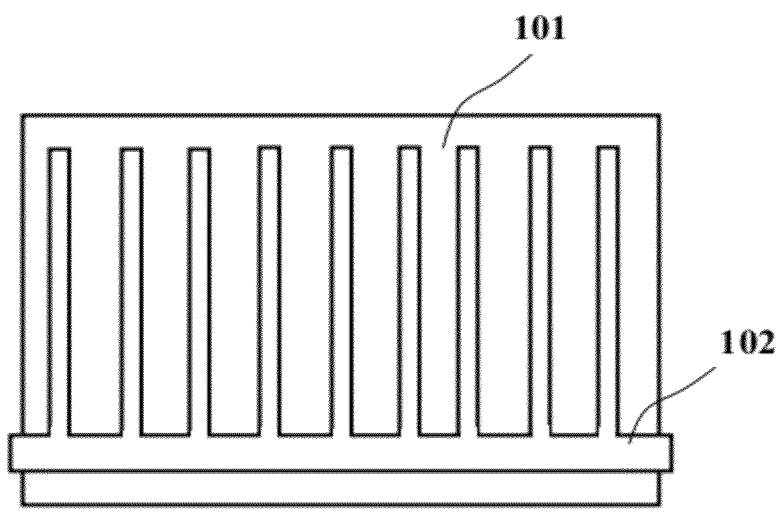
FIG. 3c is a top view of a conductive structure included in an electrode tape according to an embodiment of the present application.
Figure 3D:
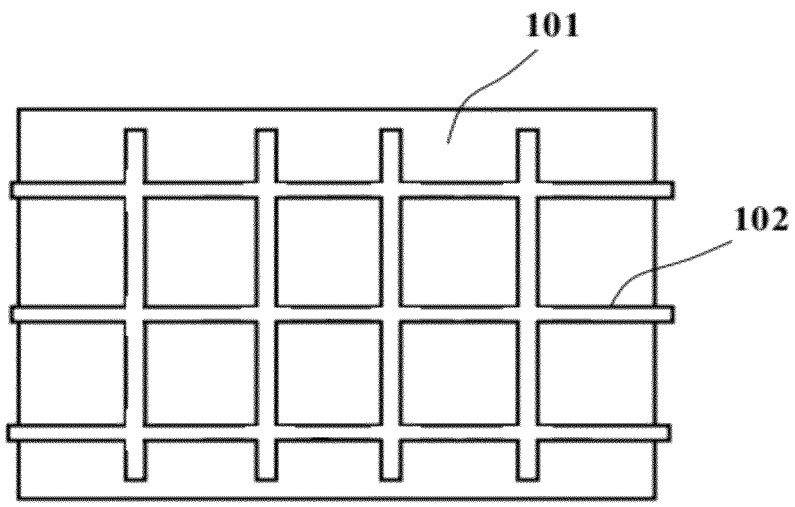
FIG. 3d is a top view of a conductive structure included in an electrode tape according to an embodiment of the present application.
Figure 3E:
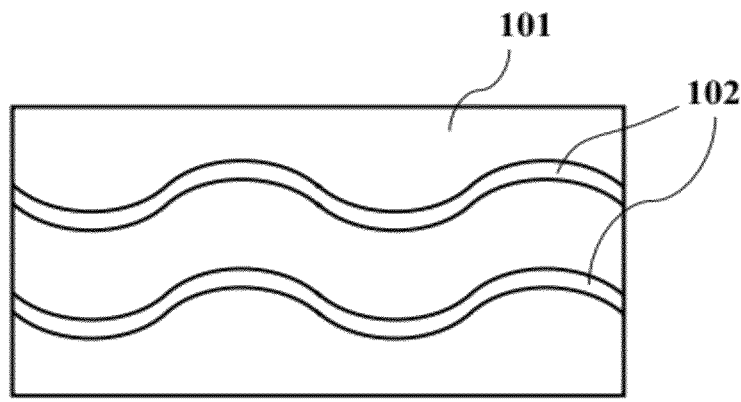
FIG. 3e is a top view of an electrode tape according to an embodiment of the present application.
Figure 3F:
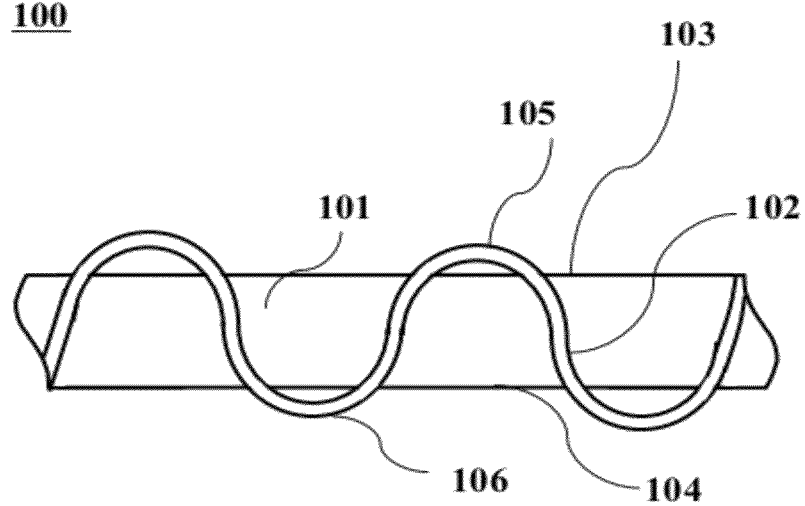
FIG. 3f is a side view of an electrode tape according to an embodiment of the present application.

It shall be noted that the adhesive film 101 shown in this embodiment is formed piece by piece and is shaped into an adequate size beforehand. However, in other examples, it also can be manufactured by a roll-to-roll process, as will be described below. Furthermore, the number of the metal wires included the conductive structure 102 is not limited, in other words, more or less metal wires can be included in the conductive structure 102, as shown in FIG. 3a. Moreover, a cross-section of the metal wires 102a and 102b is not limited to a circular shape as shown above. For example, it also can be formed in other shape such as triangular, square, trapezoid, pentagonal, or other polygonal cross-sections, as shown in FIG. 3b. The conductive structure 102 also can include electrode structures other than metal wires, such as a comb shape electrode or a mesh electrode, as shown in FIG. 3c or FIG. 3d. The material of the conductive structure 102 can be, for example, selected from a group consisted of copper, tin, silver, zinc, iron, gold, platinum, lead, aluminum and the combination thereof. Besides, in addition to the linear arrangement shown above, the metal wires also can be arranged as curve or twist, such as a wave-shape or a zigzag shape. For example, the wave-shape metal wires are extended in a plane substantially parallel to the first adhesive surface 103 and/or the second adhesive surface 104 as shown in FIG. 3e, or in a plane substantially vertical to the first adhesive surface 103 and/or the second adhesive surface 104 as shown in FIG. 3f. Further, the metal wires can be parallel or non-parallel to each other depending on the particular design requirement. Please note that this embodiment does not limit the scope of the present application.

The adhesive film 101 of the electrode tape 100 includes the first adhesive surface 103 and the second adhesive surface 104 and is made of adhesive material. Therefore, the electrode tape 100 is double-sided adhesive. Besides, the conductive structure 102 of the electrode tape 100 includes the exposed first contact point 105 and the exposed second contact point 106. Therefore, the electrode tape 100 includes double-sided conductivity.

Figure 4:
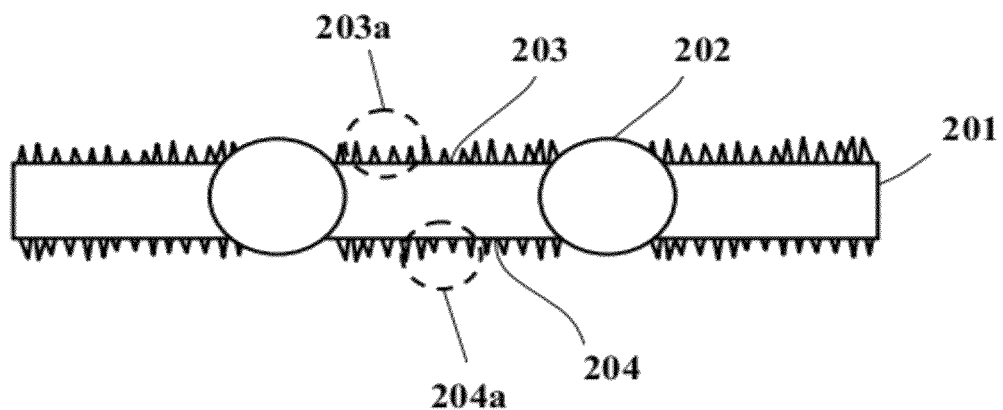
FIG. 4 is a cross-sectional view of an electrode tape according to an embodiment of the present application.

Referring FIG. 4, it is side view of an electrode tape according to another embodiment of the present application.

As shown in the figure, the electrode tape 200 includes a main structure similar to that of the electrode tape 100 which includes an adhesive film 201 and a conductive structure 202. The adhesive film 201 includes a first adhesive surface 203 and a second adhesive surface 204.

In this embodiment, the first adhesive surface 203 further includes micro-protrusions 203a and the second adhesive surface 204 further includes micro-protrusions 204a. The micro-protrusions 203a and 204a form a rough surface, which provides more contact area and facilitates the process for adhering the adhesive film 201 to a surface, such as a solar cell, by squeezing out unnecessary air therebetween. Hence, the adhesion of the adhesive film 201 is increased. The arithmetical average surface roughness (Ra) of the micro-protrusions 203a of the first adhesive surface 203 and the micro-protrusions 204a of the second adhesive surface 204 is, for example, from about 1 μm to about 1 mm. In this embodiment, the method of increasing the roughness of the first adhesive surface 203 and the second adhesive surface 204 is done by forming micro-protrusions 203a, 204a. However, in other embodiments, other methods can be used to increase the roughness of the first adhesive surface 203 and the second adhesive surface 204, such as forming micro-concaves thereon.

Figure 5:
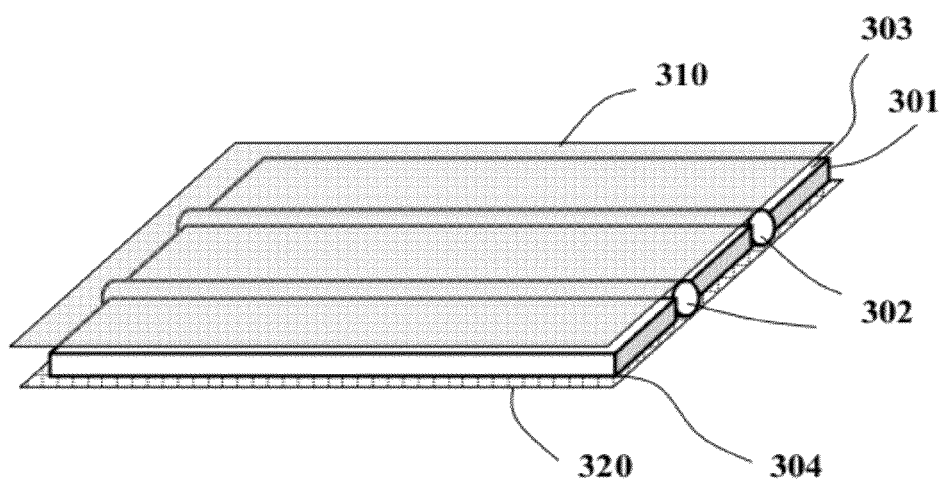
FIG. 5 is a front view of an electrode tape according to an embodiment of the present application.

Referring to FIG. 5, it is a front view of an electrode tape according to still another embodiment of the present application.

As shown in the figure, the electrode tape 300 includes a main structure similar to that of the electrode tape 100. In this embodiment, the electrode tape 300 further includes a first protective film 310 and a second protective film 320. The first protective film 310 is releasably pasted onto a first adhesive surface 303 of the adhesive film 301 and is used to protect to the first adhesive surface 303. Similarly, the second protective film 320 is releasably pasted onto a second adhesive surface 304 of the adhesive film 301 and is used to protect the second adhesive surface 304. In this embodiment, before the electrode tape 300 is being used, the first protective film 310 and the second protective film 320 can protect the surfaces of the electrode tape 300. Thereafter, the first protective film 310 and the second protective film 320 can be released from the electrode tape 300 in order to adhere the electrode tape 300 to a surface of a solar cell and proceed a following manufacturing process. The process of adhering the electrode tape 300 to solar cells will be described in detail below.

The first protective film 310 and the second protective film 320 can be formed of transparent or opaque materials. For example, the first protective film 310 and/or the second protective film 320 can be a release sheet formed by coating a release agent on a base film. The base film can be, for example, polyethylene terephthalate (PET) or paper. The release agent can be, for example, silicone.

Figure 6A:
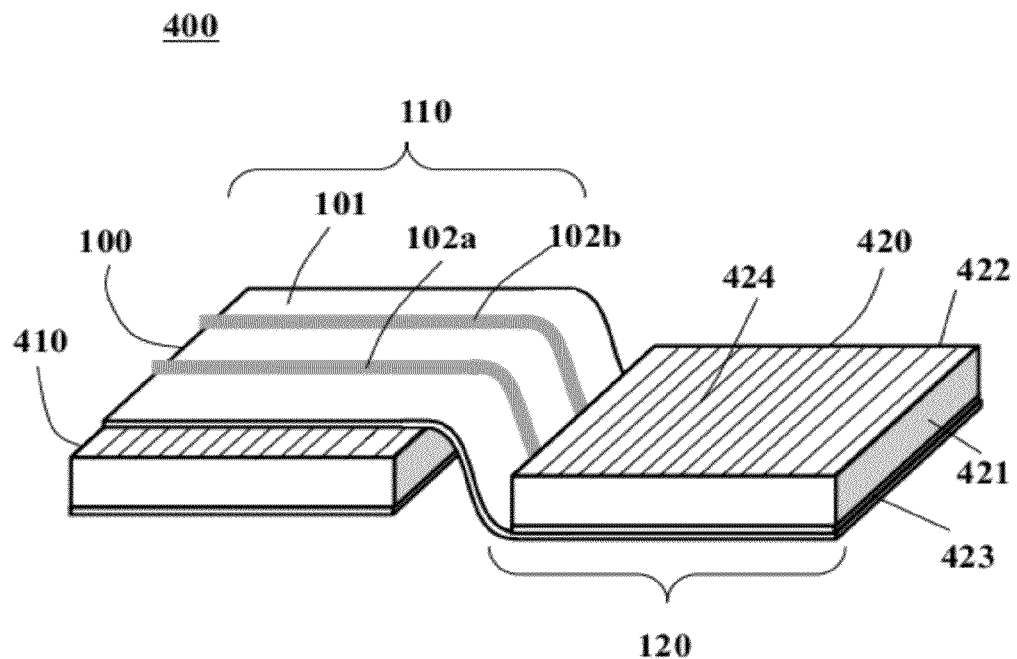
FIG. 6a is a front view of a series connected type solar module according to an embodiment of the present application.

Referring to FIG. 6a, it is a front view of a series-connected type solar module.

As shown in the figure, the solar module 400 includes two solar cells connected in series, i.e., a first solar cell 410 and a second solar cell 420. The first solar cell 410 and the second solar cell 420 are electrically connected to each other through the electrode tape 100 of the present application.

Figure 6B:
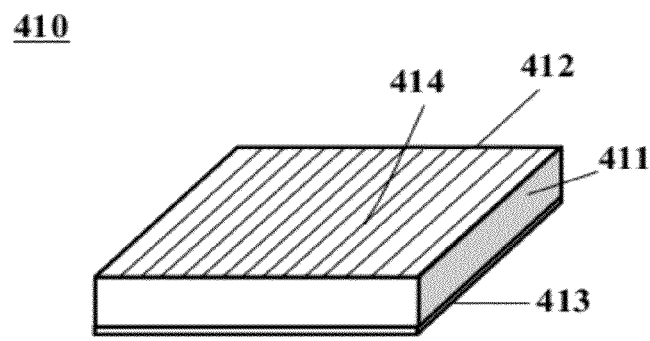

Referring to FIG. 6b, it is a front view of the first solar cell 410. The first solar cell 410 includes a substrate 411, a front electrode 412 at a light receiving side and a back electrode 413 at a rear side. There is a plurality of finger electrodes 414 formed on the front electrode 412. In this embodiment, for example, the first solar cell 410 includes a multicrystalline silicon solar cell. The substrate 411 includes a multicrystalline silicon substrate. The finger electrodes 414 are made of silver, for example.

The second solar cell 420 includes a structure similar to the first solar cell 410. The second solar cell 420 includes a front electrode 422, a back electrode 423 and a plurality of finger electrodes 424 as shown in FIG. 6a. In this embodiment, the first solar cell 410 and the second solar cell 420 are multicrystalline silicon solar cells. However, in other embodiments, the first solar cell 410 or the second solar cell 420 can be other types of solar cells, such as monocrystalline silicon solar cells, amorphous silicon solar cells or thin film solar cells.

The electrode tape 100 includes a first terminal 110 and a second terminal 120. The first terminal 110 of the electrode tape 100 is adhered to the front electrode 412 of the first solar cell 410 while the second terminal 120 of the electrode tape 100 is adhered to the back electrode 423 of the second solar cell 420. Besides, the first adhesive surface 103 on the first terminal 110 of the electrode tape 100 faces outwardly to the front electrode 412 of the first solar cell 410, while the second adhesive surface 104 on the first terminal 110 of the electrode tape 100 is adhered to the front electrode 412 of the first solar cell 410. Moreover, the first metal wire 102a and the second metal wire 102b of the electrode tape 100 are intersected with the finger electrodes 414 of the first solar cell 410. The first adhesive surface 103 on the second terminal 120 of the electrode tape 100 is adhered to the back electrode 423 of the second solar cell 420, while the second adhesive surface 104 on the second terminal 120 of the electrode tape 100 faces outwardly to the back electrode 423 of the second solar cell 420. Thus, the first solar cell 410 and the second solar cell 420 are electrically connected in series through the electrode tape 100.

Figure 7:
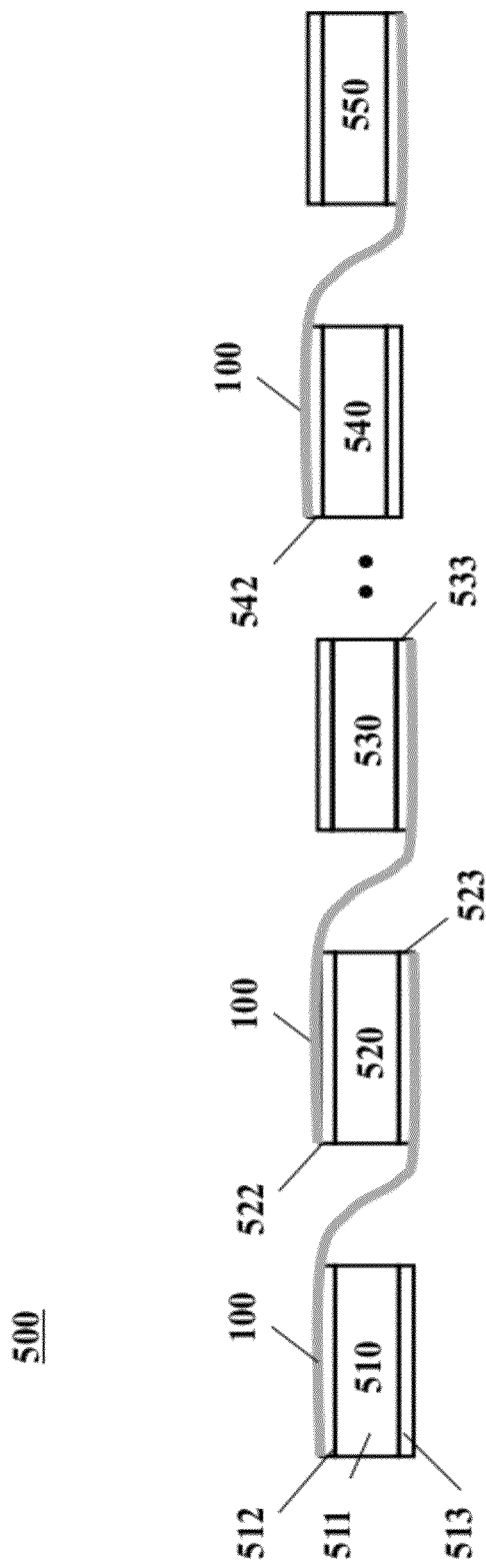
FIG. 7 is a front view of a series connected type solar module according to another embodiment of the present application.

Referring to FIG. 7, it is a front view of another series connected type solar module.

As shown in the figure, the solar module 500 includes a plurality of solar cells connected in series, i.e., a first solar cell 510, a second solar cell 520, a third solar cell 530, . . . , a $(N-1)^{th}$ solar cell 540, and a $N^{th}$ solar cell 550 (N is the total number of solar cells and should be a natural number). The first solar cell 510 to the $N^{th}$ solar cell 550 are electrically connected in series through the electrode tape 100 of the present application.

The first solar cell 510 includes a structure similar to the first solar cell 410 shown in FIG. 6b. The first solar cell 510 includes a substrate 511, a front electrode 512 and a back electrode 513. Besides, the second solar cell 520, the third solar cell 530, the $(N-1)^{th}$ solar cell 540, and the $N^{th}$ solar cell 550 all include the same structure with the first solar cell 510.

As shown in the figure, the first solar cell 510, the second solar cell 520, the third solar cell 530, the $(N-1)^{th}$ solar cell 540, and the $N^{th}$ solar cell 550 are arranged with their front electrodes face upwardly and their back electrode face downwardly. The front electrode 512 of the first solar cell 510 is electrically connected to the back electrode 523 of the second solar cell 520 through the electrode tape 100. Similarly, the front electrode 522 of the second solar cell 520 is electrically connected to the back electrode 533 of the third solar cell 530. The front electrode 542 of the $(N-1)^{th}$ solar cell 540 is electrically connected to the $N^{th}$ solar cell 550. Thus, the first solar cell 510 to the $N^{th}$ solar cell 550 are electrically connected in series.

Hereinafter, methods of manufacturing the electrode tape of the embodiment will be described.

Figure 8A:
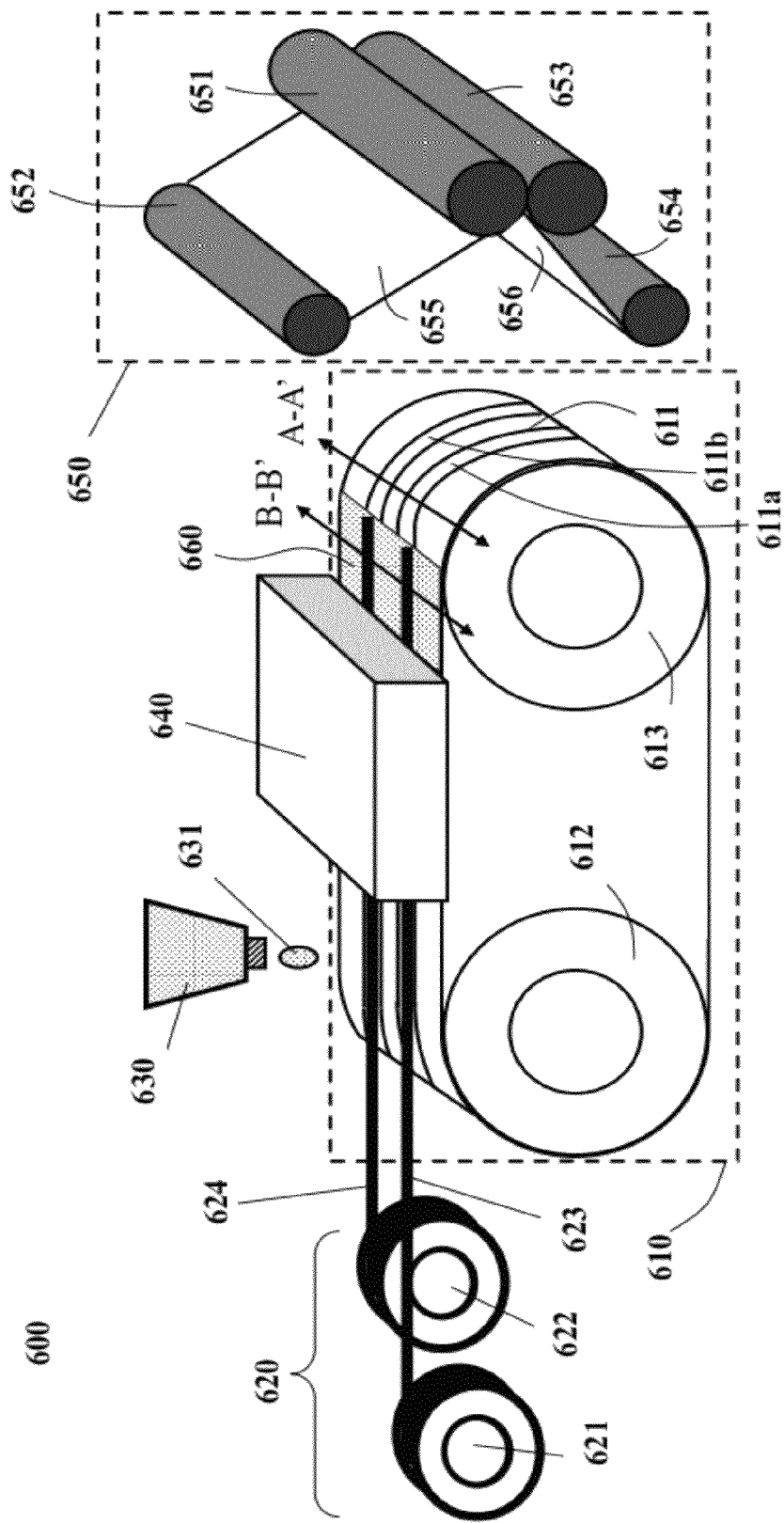
FIG. 8a is a front view of an electrode tape manufacturing machine according to an embodiment of the present application.

For example, one method of manufacturing the electrode tape according to one embodiment includes, but not limited to, a roll-to-roll process. Referring to FIG. 8a, it is a front view of an electrode tape manufacturing machine according to an embodiment of the present application. As shown in the figure, the electrode tape manufacturing machine 600 includes a conveyor 610, metal wire coils 620, an adhesive material supply unit 630, a heating unit 640 and a protective film pasting unit 650.

Figure 8B:
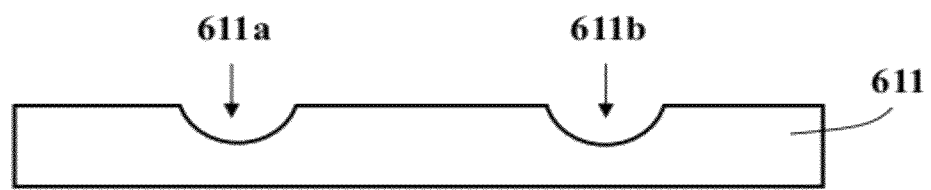

The conveyor 610 includes a molding belt 611 and two rollers 612, 613. The molding belt 611 encloses the two rollers 612, 613 and is driven by the two rollers 612, 613. A cross-section of the molding belt 611 is shown in FIG. 8*b*, which is a cross-sectional view taken along line A-A' in FIG. 8*a*. As shown in FIG. 8*b*, the molding belt 611 includes two grooves 611*a* and 611*b*.

The metal wire coils 620 are positioned at an entrance side of the conveyor 610. The metal wire coils 620 include shafts 621, 622 and metal wires 623, 624. The metal wires 623,624 are wound around the two shafts 621 and 622 respectively.

The adhesive material supply unit 630 is positioned above the molding belt 611 and is used to feed adhesive material 631 onto a surface of the molding belt 611. The heating unit 640, for example, an oven, is positioned at a middle section of the molding belt 611 and is used to remove solvent contained in the adhesive material 631 and cure the adhesive material 631. In other examples, the heating unit can be called "curing unit".

The protective film pasting unit 650 is positioned at an exit side of the conveyor 610 and includes a first reel 651, a second reel 652, a third reel 653, a fourth reel 654, a first protective film 655 and a second protective film 656. The first reel 651 and the third reel 653 are adjacent to each other and are arranged in parallel. The first protective film 655 is wound around the second reel 652 while the second protective film 656 is wound around the fourth reel 654.

Hereinafter, the method of manufacturing the electrode tape of the embodiment by utilizing the electrode tape manufacturing machine 600 will be described.

First, metal wires 623, 624 of the metal wire coils 620 are pulled onto the surface of the molding belt 611. Wherein, the two metal wires 623 and 624 are embedded in the two grooves 611*a* and 611*b*. However, only substantial parts of the metal wires 623, 624 are embedded in the two grooves 611*a* and 611*b* and other portions of the metal wires 623, 624 are exposed on the two grooves 611*a* and 611*b*. Thereafter, the adhesive material 631 is fed onto the molding belt 611 from the adhesive material supply unit 630. The feeding amount of the adhesive material 631 is able to form an adhesive film with dry thickness, not greater than the thickness of the two metal wires 623, 624. Besides, the dry thickness of the adhesive film 661 is able to provide enough adhesion to the sidewalls of the two metal wires 623 and 624. In this embodiment, the thickness of the adhesive film 661 can be, for example, from about 10 μm to about 5 mm, preferably, from about 25 μm to about 2 mm.

Figure 8C:
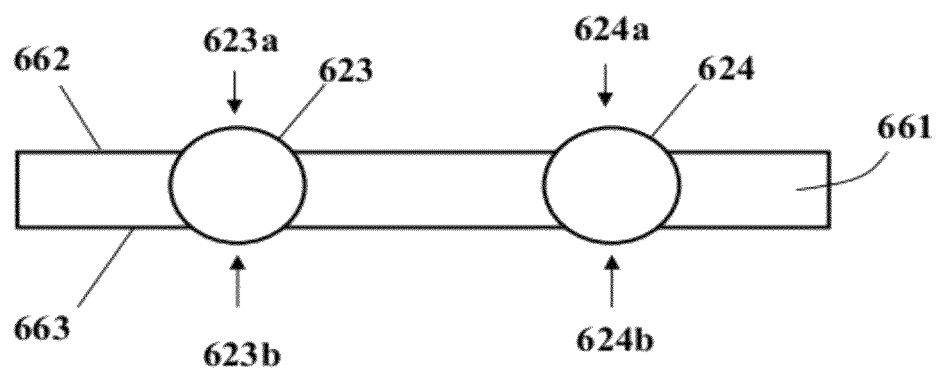

Then, the adhesive material 631 together with the two metal wires 623, 624 over the molding belt 611 are conveyed into the oven 640 by running the two rollers 612, 613. The temperature of the oven 640 can be set at, for example, from about 25° C. to about 180° C. The moisture or solvent contained in the adhesive material 631 is then heated and evaporated by the oven 640. Thus, after baking, the cured adhesive material 631 together with the two metal wires 623,624 can form an electrode tape 660. The cross-section of the electrode tape 660 is shown in FIG. 8*c*, which is a cross-sectional view along line B-B' in FIG. 8*a*. As shown in the figure, the electrode tape 660 includes the adhesive film 661, i.e., formed of the adhesive material 631, and the two metal wires 623, 624. Further, the adhesive film 661 includes a first adhesive surface 662 and a second adhesive surface 663 and each of the two metal wires 623,624 includes a first contact point 623*a*, 624*a* and a second contact point 623*b*, 624*b*, respectively The first contact points 623*a*, 624*a* are exposed on the first adhesive surface 662 while the second contact points 623*b*, 624*b* are exposed on the second adhesive surface 663.

The electrode tape 660 can be further pasted with protective films on its first adhesive surface 662 and second adhesive surface 663 via the protective film pasting unit 650. The method will be described below.

First, the electrode tape 660 is driven into the protective film pasting unit 650 and then the first protective film 655 and the second protective film 656 are pulled onto the surfaces of the electrode tape 660 from the second reel 652 and the fourth reel 654. Then, the first protective film 655, the electrode tape 660 and the second protective film 656 are pressed by the first reel 651 and the third reel 653 and the first protective film 655 and the second protective film 656 are pasted onto the surfaces of the electrode tape 660.

Figure 9A:
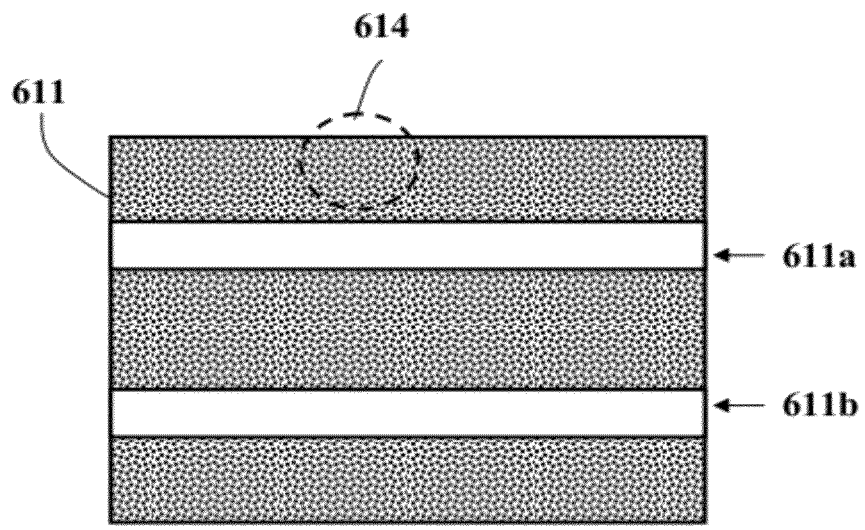
Figure 9B:
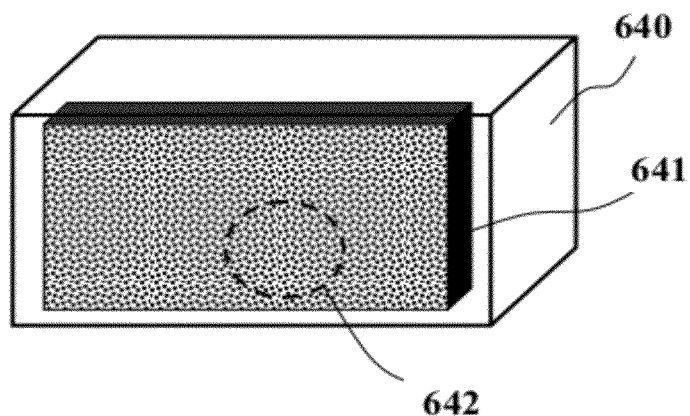
FIG. 9b is a bottom view of an oven which includes a molding plate according to an embodiment of the present application.

Besides, as shown in FIG. 9*a*, the molding belt 611 can further include a roughness 614. Therefore, an electrode tape 660 can be formed with micro-protrusions shown in FIG. 4 by feeding the adhesive material 631 onto the surface of the molding belt 611 with roughness 614. In other examples, the oven 640 can include a molding plate 641 with a roughness 642, as shown in FIG. 9*b*. By pressing the surface of the adhesive material 631 by this molding plate 641, the electrode tape 660 also can be made with micro-protrusions shown in FIG. 4.

Persons skilled in the art would understand that the two metal wires 623, 624 shown in this embodiment is provided for the purpose of exemplification only and more or less metal wires and corresponding grooves also can be used. Besides, the electrode tape manufacturing machine also can include different designs, such as, more or less metal wire coils, ovens or rollers, different arrangement and replacement with equivalent functional parts, etc. Hereinafter, another type of electrode tape manufacturing machine is shown below, for example.

Figure 10:
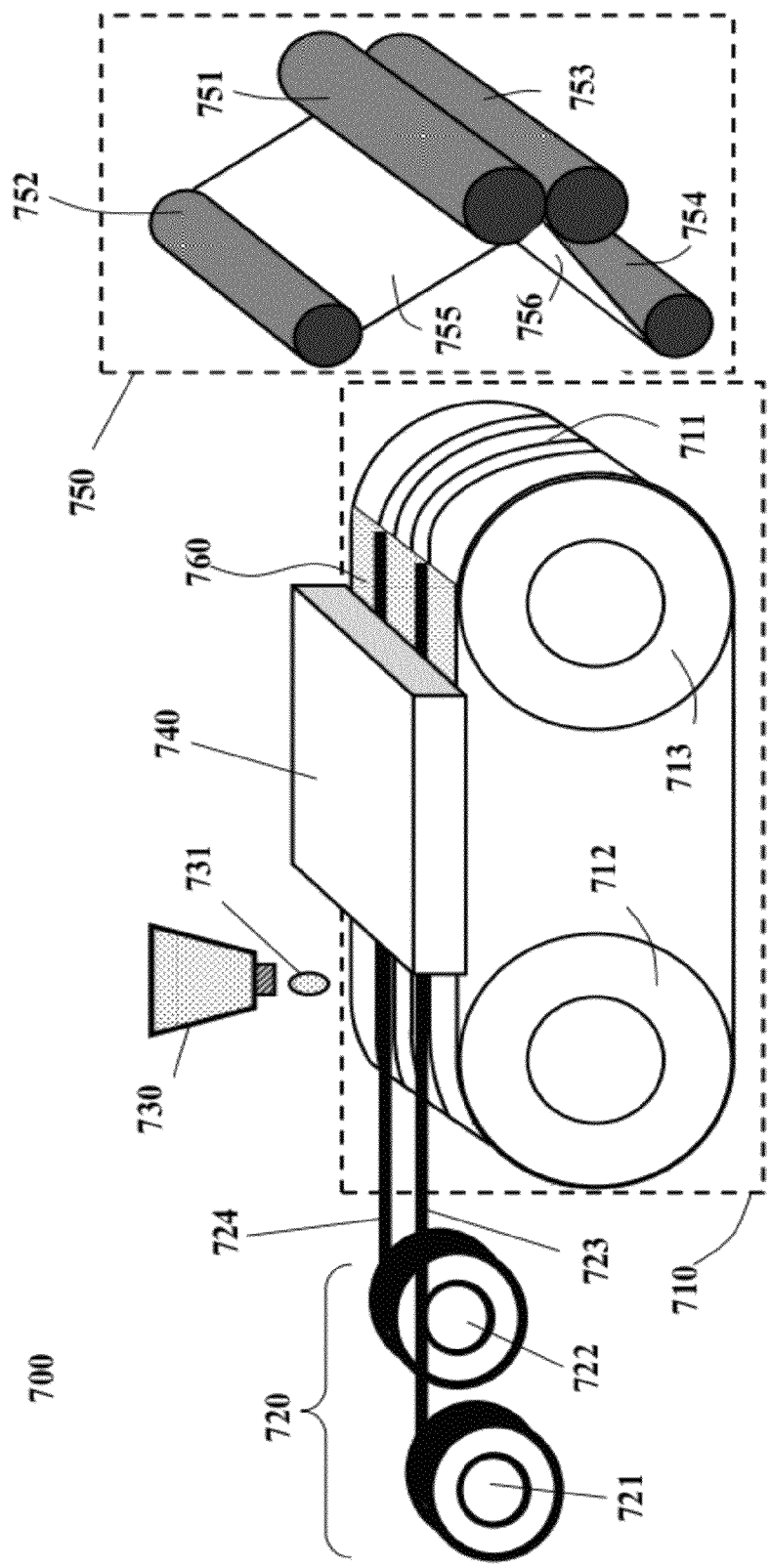
FIG. 10 is a front view of an electrode tape manufacturing machine according to another embodiment of the present application.

Referring to FIG. 10, it is a front view of another electrode tape manufacturing machine. The electrode tape manufacturing machine 700 includes an UV irradiation device 740 rather than the heating unit (oven) 640, while other sections of the electrode tape machine 700 and the electrode tape manufacturing machine 600 are the same. That is, the electrode tape manufacturing machine 700 also include a conveyor 710, metal wire coils 720, an adhesive material supply unit 730 and a protective film pasting unit 750. The conveyor 710 includes a molding belt 711 and two rollers 712,713. The metal wire coil 720 includes shafts 721, 722 and metal wires 723, 724. The protective film pasting unit 750 includes a first reel 751, a second reel 752, a third reel 753, a fourth reel 754, a first protective film 755 and a second protective film 756. In other embodiments, an electrode tape manufacturing machine can include, but not limited to, a heating unit and an UV irradiation unit at the same time.

The method of forming an electrode tape by using the electrode tape manufacturing machine 700 will be described below.

First, the metal wires 723, 724 are pulled onto a surface of the molding belt 711. Then, an UV polymerizable adhesive material 731, such as epoxy resin, is fed onto the surface of the molding belt 711 from the adhesive material supply unit 730. The feeding amount of the UV polymerizable adhesive material 731 is able to make an adhesive film with dry thickness after curing, not greater than the thickness of the two metal wires 723, 724. Besides, the dry thickness of the adhesive material 731 is able to provide enough adhesion to the sidewalls of the two metal wires 723 and 724.

Next, the UV polymerizable adhesive material 731 and the metal wires 723, 724 are conveyed into the UV irradiation unit 740 by running the two rollers 712, 713. The UV polymerizable adhesive material 731 is polymerized and cured by UV irradiation. Meanwhile, the two metal wires 723, 724 are embedded into the UV polymerizable adhesive material 731 and form an electrode tape 760. Then, the electrode tape 760 may be further proceeded with a roll-up step or a protective film pasting step.

Figure 11:
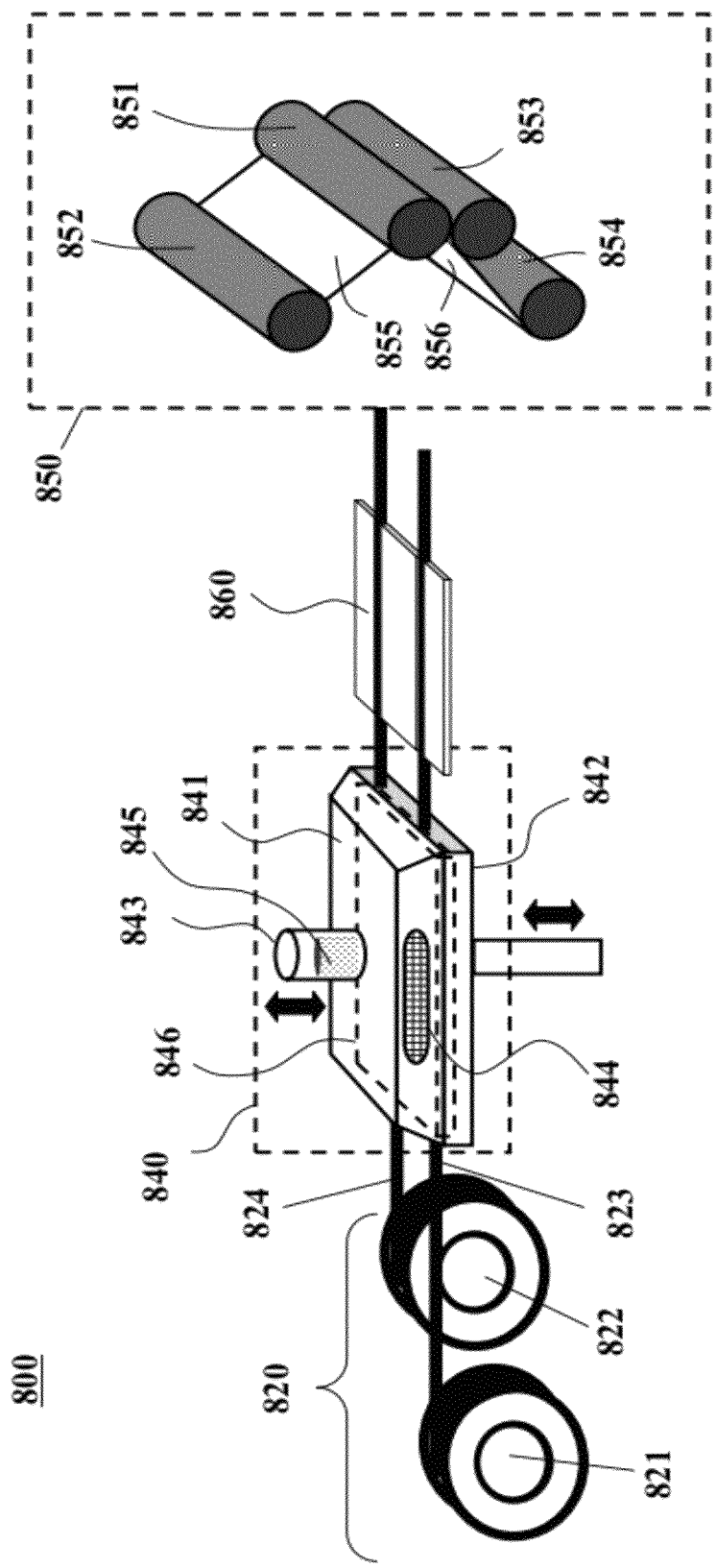
FIG. 11 is a front view of an electrode tape manufacturing machine according to still another embodiment of the present application.

Referring to FIG. 11, it is a front view of still another type of electrode tape manufacturing machine. The electrode tape manufacturing machine 800 includes a mold 840 rather than the conveyor 610 and the heating unit 640 which are included in the electrode tape manufacturing machine 600. Other sections of the electrode tape manufacturing machines 600 and 800 are the same. That is, the electrode tape manufacturing machine also includes metal wire coils 820 and a protective film pasting unit 850. The metal wire coils 820 include shafts 821, 822 and metal wires 823, 824. The protective film pasting unit 850 includes a first reel 851, a second reel 852, a third reel 853, a fourth reel 854, a first protective film 855 and a second protective film 856.

The mold 840 includes an upper molding part 841, a lower molding part 842, an inlet 843 and a heater 844. Both of the upper molding part 841 and the lower molding part 842 can be moved upwardly and downwardly and the upper molding part 841 and the lower molding part 842 can be connected to each other to form a space 846. The inlet 843 is connected to the upper molding part 841 and is used to feed an adhesive material 845 into the space 846. The heater 844, for example, is positioned inside the upper molding part 841 or the lower molding part 842. The heater 844 is used to heating the upper molding part 841, the lower molding part 842 and the space 846.

The method of forming an electrode tape by using the electrode tape manufacturing machine 800 will be described below.

First, the mold 840 is opened by moving the upper molding part 841 upwardly and the lower molding part 842 downwardly. Next, the metal wires 823, 824 are pulled onto the surface of the lower molding part 842. After that, the mold 840 is closed again. Then, the adhesive material 845 is fed into the space 846 through the inlet 843. The feeding amount of the adhesive material 845 in the lower molding part 842 is able to make an adhesive film with dry thickness, not greater than a height of the two metal wires' 723, 724 on a bottom surface of the lower molding part 842. Besides, the dry thickness of the adhesive material 845 is able to provide enough adhesion to the sidewalls of the two metal wires 823 and 824.

Then, the adhesive material 845 inside the space 846 is heated and cured by using the heater 844 to remove solvent contained therein. Thus, the adhesive material 845 together with the two metal wires 823, 824 form an electrode tape 860 after curing. Thereafter, a step of pasting the first protective film 855 and the second protective film 856 can be further proceeded with the protective film pasting unit 850.

In the above mentioned method, the adhesive material 845 is fed into the mold 840 from the upper molding part 841. However, in other embodiments, the adhesive material 845 can be fed from the lower molding part 842 or from the upper molding part 841 and the lower molding part 842 at the same time.

The description shown above is only about several embodiments of the present application and is not intended to limit the scope of the present application. Any equivalent variations or modifications without departing from the spirit disclosed by the present application should be included in the appended claims.

What is claimed is:

1. An electrode tape, comprising:
    an adhesive film including a first adhesive surface and a second adhesive surface, wherein the first adhesive surface and the second adhesive surface face outwardly to each other; and
    a conductive structure embedded in the adhesive film and including a first contact point and a second contact point respectively disposed on opposite sides of the conductive structure, wherein the first contact point is exposed on the first adhesive surface and the second contact point is exposed on the second adhesive surface, and at least one of the first adhesive surface and the second adhesive surface includes the arithmetical average surface roughness of the at least one of the first adhesive surface and the second adhesive surface is of about 1 µm to about 1 mm.

2. The electrode tape according to claim 1, wherein the electrode tape further includes a protective film which is releasably pasted onto at least one of the first adhesive surface and the second adhesive surface.

3. The electrode tape according to claim 2, wherein the protective film includes a release sheet.

4. The electrode tape according to claim 1, wherein the material of the conductive structure is selected from the group consisted of copper, tin, silver, zinc, iron, gold, platinum, lead, aluminum and the combination thereof.

5. The electrode tape according to claim 1, wherein the conductive structure includes a plurality of metal wires.

6. The electrode tape according to claim 1, wherein the conductive structure includes a comb-shape electrode or a mesh electrode.

7. The electrode tape according to claim 1, wherein the material of the adhesive film is selected from the group consisted of acrylic adhesive, silicon adhesive, epoxy adhesive, ethylene vinyl acetate adhesive, polyvinyl ether adhesive, polyurethane adhesive, polyamide adhesive, inorganic adhesive and the combination thereof.

8. The electrode tape according to claim 1, wherein the material of the adhesive film includes thermal plastic adhesive.

* * * * *